(12) United States Patent
Fujita

(10) Patent No.: US 10,530,223 B2
(45) Date of Patent: Jan. 7, 2020

(54) COMPONENT MOUNTER DRIVE SYSTEM

(71) Applicant: FUJI CORPORATION, Chiryu-shi (JP)

(72) Inventor: Masatoshi Fujita, Anjo (JP)

(73) Assignee: FUJI CORPORATION, Chiryu-shi (JP)

(*) Notice: Subject to any disclaimer, the term of this patent is extended or adjusted under 35 U.S.C. 154(b) by 4 days.

(21) Appl. No.: 15/565,957

(22) PCT Filed: Apr. 16, 2015

(86) PCT No.: PCT/JP2015/061760
§ 371 (c)(1),
(2) Date: Oct. 12, 2017

(87) PCT Pub. No.: WO2016/166877
PCT Pub. Date: Oct. 20, 2016

(65) Prior Publication Data
US 2018/0109168 A1    Apr. 19, 2018

(51) Int. Cl.
*G05B 11/01* (2006.01)
*H02K 11/30* (2016.01)
(Continued)

(52) U.S. Cl.
CPC .......... *H02K 11/30* (2016.01); *G05B 19/409* (2013.01); *H05K 13/0486* (2013.01)

(58) Field of Classification Search
CPC ....... H02K 11/30; G05B 19/409; H02P 29/00; H05K 13/0486
(Continued)

(56) References Cited

U.S. PATENT DOCUMENTS

2010/0164423 A1* 7/2010 Nakayama ......... G05B 19/0425
318/565
2013/0241460 A1  9/2013 Ushiyama et al.
(Continued)

FOREIGN PATENT DOCUMENTS

JP  2000-99156 A   4/2000
JP  2005-348475 A  12/2005
(Continued)

OTHER PUBLICATIONS

Extended European Search Report dated Jan. 5, 2018 in Patent Application No. 15889215.8, 7 pages.
(Continued)

*Primary Examiner* — Bickey Dhakal
*Assistant Examiner* — Gabriel Agared
(74) *Attorney, Agent, or Firm* — Oblon, McClelland, Maier & Neustadt, L.L.P.

(57) ABSTRACT

With respect to servo amplifiers attached to a component mounter, a motor unit of at of a drive mechanism assembled on a mounting head is attached to be exchangeable. A control device of the component mounter switches the servo amplifier from a servo on state to a servo off state before exchange of the motor unit, maintains servo amplifier system power in an on state, initializes an encoder of the motor unit connected to the servo amplifier after the motor unit has been exchanged, and returns the servo amplifier to a servo on state. By this, the servo motor of the exchange motor unit achieves a state in which feedback control can be performed based on detection information of the encoder, and operation of the exchanged motor unit can be started.

4 Claims, 2 Drawing Sheets

(51) Int. Cl.
*G05B 19/409* (2006.01)
*H05K 13/04* (2006.01)

(58) Field of Classification Search
USPC .......................................................... 318/560
See application file for complete search history.

(56) References Cited

U.S. PATENT DOCUMENTS

2015/0237773 A1    8/2015  Nishiyama
2016/0198596 A1*  7/2016  Kawai ................ H05K 13/0061
                                                                           29/739

FOREIGN PATENT DOCUMENTS

| JP | 2013-135049 A | 7/2013 |
| JP | 2013-192414 A | 9/2013 |
| WO | WO 2014/033900 A1 | 3/2014 |
| WO | WO 2015/045002 A1 | 4/2015 |

OTHER PUBLICATIONS

International Search Report dated Jul. 14, 2015 in PCT/JP2015/061760 filed Apr. 16, 2015.

\* cited by examiner

COMPONENT MOUNTER DRIVE SYSTEM

TECHNICAL FIELD

The present application relates to a component mounter drive system provided with a motor unit including a servo motor equipped with an encoder exchangeably attached to a specified portion of the component mounter and a servo amplifier that performs feedback control of rotation of the servo motor attached to the component mounter.

BACKGROUND ART

Servo motors are used as a drive source for various drive mechanisms of a component mounter, for example, as disclosed in patent literature 1 (JP-A-2013-135049), a servo motor is used as a drive source for raising and lowering a suction nozzle, or a servo motor is used as a drive source that drives an R axis, Q axis (θ axis), or Z axis of a rotating-type mounting head that holds multiple suction nozzles. Generally, the rotation of a servo motor is detected by an encoder, and in the servo amplifier detection information of the encoder is compared to an instruction value so as to perform feedback control on the rotation of the servo motor.

Also, in recent years, as disclosed in patent literature 2 (WO2014/033900), a rotating-type mounting head provided with three drive mechanisms that individually drive an R axis, a Q axis, and a Z axis is exchangeably attached to a head moving device of the component mounter.

CITATION LIST

Patent Literature

Patent literature 1: JP-A-2013-135049
Patent literature 2: WO2014/033900
Patent literature 3: JP-A-2005-348475

SUMMARY

Technical Problem

However, a driving power source line for supplying driving power to the servo motor and an encoder signal line for sending detection signals of the encoder are provided between a motor unit that includes a servo motor equipped with an encoder and a servo amplifier. Therefore, conventionally, to maintain reliability of detection information of the encoder after a motor unit is exchanged, it is thought necessary to turn off system power to the servo amplifier and exchange the motor unit in a non-connected state.

But, providing a drive circuit to cut system power to the servo amplifier on the assumption that the motor unit is to be exchanged or the like, results in an increase in the quantity of components and a more complex circuit configuration, meaning that it takes longer to design the circuit configuration, which has the downside of increasing costs. Further, after exchanging the motor unit, it is necessary to turn the servo amplifier system power back on and to restart the system, which takes time, leading to long work time for exchanging the motor unit, thus causing a problem of a decrease in the operating rate (productivity) of the component mounter.

With respect to this, in patent literature 3 (JP-A-2005-348475), technology is disclosed for recovering from mistaken operation of an encoder (sensor for electric motor), but the above issues during motor unit exchange are still not resolved with the technology of patent literature 3.

Solution to Problem

To solve the above problems, the present disclosure is a component mounter drive system including: a component mounter including a servo motor as a drive source for a drive target of the component mounter, an encoder for detecting rotation of the servo motor, a servo amplifier for performing feedback control of rotation of the servo motor based on detection information of the encoder, and a control device for entering a command value of the feedback control to the servo amplifier; a motor unit including the servo motor and the encoder, the motor unit being exchangeably attached to a specified portion of the component mounter to which the servo amplifier is attached; and an input means configured to allow an operator to input a motor unit exchange signal to the control device before exchanging the motor unit, wherein the control device, when the motor unit exchange signal is inputted, switches the servo amplifier to a servo off state, maintains system power of the servo amplifier in an on state, initializes the encoder connected to the servo amplifier after the motor unit has been exchanged, and then returns the servo amplifier to a servo on state.

With this configuration, when an operator inputs a motor unit exchange signal to the control device before exchanging a motor unit, the servo amplifier is switched to a servo off state, and the servo amplifier system power is maintained in an off state. Accordingly, it is possible to exchange the motor unit while the servo amplifier system power is maintained in an off state. Also, after the motor unit has been exchanged, by initializing the encoder and returning the servo amplifier to a servo on state, the servo motor of the exchanged motor unit is able to have feedback control performed based on detection information of the encoder, and operation of the exchanged motor unit can be started. In this case, because it is not necessary to cut the servo amplifier system power when exchanging the motor unit, it is not necessary to provide an electric circuit for cutting the servo amplifier system power, thus reducing the quantity of components and simplifying the circuit configuration, reducing the time required to design the circuit configuration and lowering costs. Further, after exchanging the motor unit, it is not necessary to turn the servo amplifier system power back on and to restart the system, so motor unit exchange work time is reduced by the amount of time required for restarting, thus improving the operating rate (productivity) of the component mounter.

The present disclosure may be provided with a means for prohibiting exchange of the motor unit during operation of the drive target. By doing this, it is possible to prevent the servo amplifier being switched to a servo off state due to a mistaken operation of an operator during operation of the drive target.

DESCRIPTION OF EMBODIMENTS

An embodiment of the disclosure is described below. First, the overall configuration of control items of component mounter 10 is described based on FIG. 1.

Figure 1:
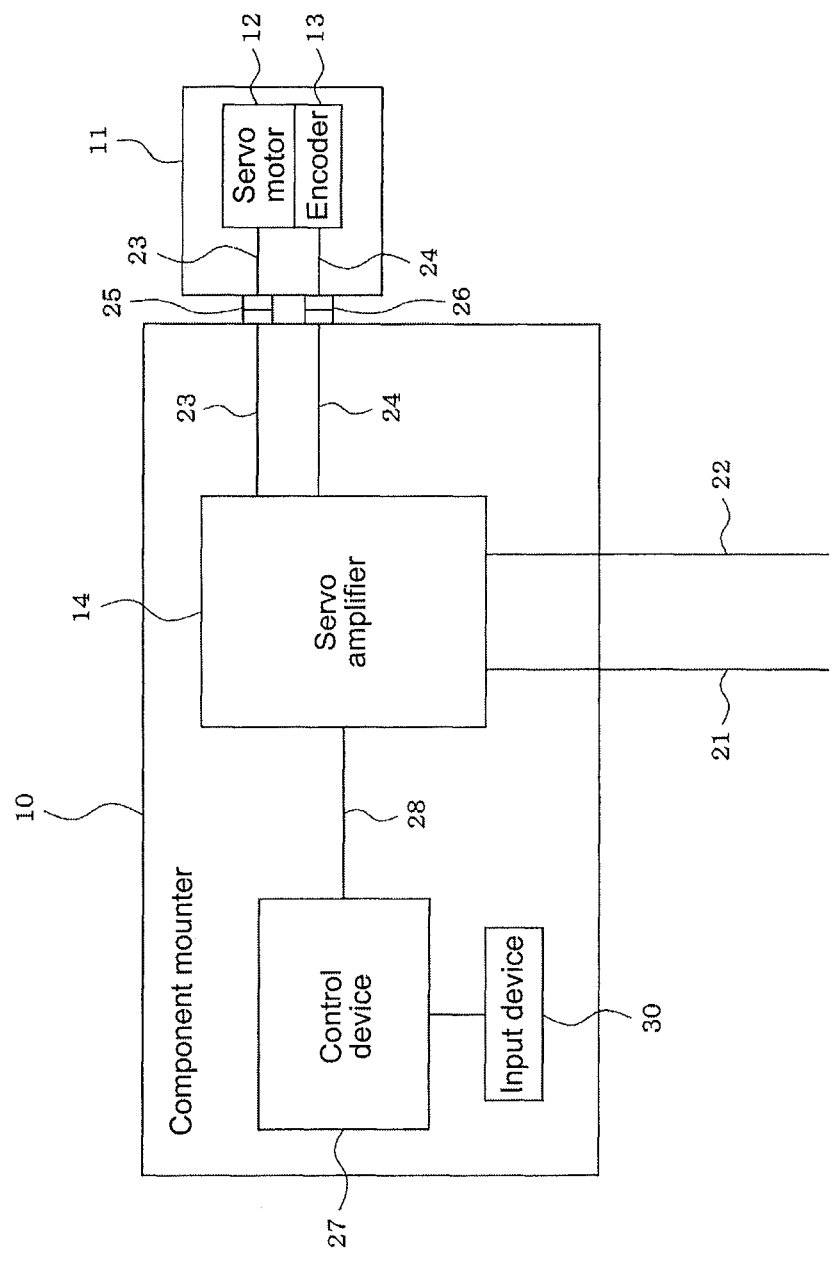
FIG. 1 is a block diagram showing connections between a motor unit and a servo amplifier in an embodiment of the present disclosure.

Multiple motor units 11 (only one motor unit 11 is shown in FIG. 1) are loaded on component mounter 10, and each motor unit 11 is provided with servo motor 12 as a drive source of a drive target, and an absolute encoder 13 for detecting a rotation angle (rotation position), rotation speed, rotation direction, and so on, of servo motor 12. Although not shown, a drive target of component mounter 10 may be, for example, a drive mechanism for an R axis, a Q axis, or a Z axis of a mounting head, a head moving device (XY robot) for moving the entire mounting head in the XY directions, or a feeder for supplying components. In the present embodiment, a mounting head is exchangeably attached to a head moving device, a three motor units 11 are assembled on the mounting head as drive mechanisms for individually driving an R axis, a Q axis, and a Z axis. Here, the R-axis drive mechanism is a drive mechanism for rotating the mounting head on its own axis so as to revolve all the suction nozzles held on the mounting head in a circumferential direction of the mounting head, the Q-axis drive mechanism is a drive mechanism for rotating each suction nozzle held on the mounting head on its own axis, and the Z-axis drive mechanism is a drive mechanism for driving each suction nozzle held on the mounting head in a vertical direction at a specified stopping position along a path of revolution of the suction nozzles.

Note that, the mounting head provided with motor units 11 of the three drive mechanisms of the R axis, the Q axis, and the Z axis is a rotating type mounting head (a so-called rotary head), but in a case of a non-rotating mounting head, the configuration is one provided with motor units 11 for two drive mechanisms for rotation and vertical movement of the suction nozzles. Alternatively, a mounting head that holds a mechanical chuck may be exchangeably attached to the head moving device.

Servo motor 12 of motor unit 11 loaded on component mounter 10 performs feedback control using servo amplifier 14 based on detection information of encoder 13. Here, one servo amplifier 14 may be provided for each of the multiple motor units 14 loaded on component mounter 10, or servo amplifiers 14 of the multiple motor units 11 may be configured from one multi-axis amplifier to perform feedback control. With respect to servo amplifiers 14 (or a multi-amplifier) attached to component mounter 10, motor unit 11 of at least one of the multiple motor units 11 (in the present embodiment, at least motor unit 11 of the drive mechanism assembled on the mounting head) is attached to be exchangeable.

Connected to servo amp 14 are system power source line 21 for supplying system power from externally, and driving power source line 22 for supplying driving power from externally. Driving power source line 23 for supplying driving power to servo motor 12 and encoder signal line 24 for sending detection information of encoder 13 to servo amplifier 14 are connected between servo amplifier 14 and motor unit 11. Driving power source line 23 and encoder signal line 24 of exchangeable motor unit 11 are connected to driving power source line 23 and encoder signal line 24 of servo amplifier 14 by connectors 25 and 26 respectively.

Control device 27 of component mounter 10 is configured from a computer, and performs control of operation of picking up a component supplied by a feeder (not shown) using a suction nozzle and mounting the component on a circuit board and so on. Communication line 28 is connected between servo amplifier 14 and control device 27 of component mounter 10, such that command values of feedback control of servo motor 12 are sent to servo amplifier 14 from control device 27 of component mounter 10.

Figure 2:
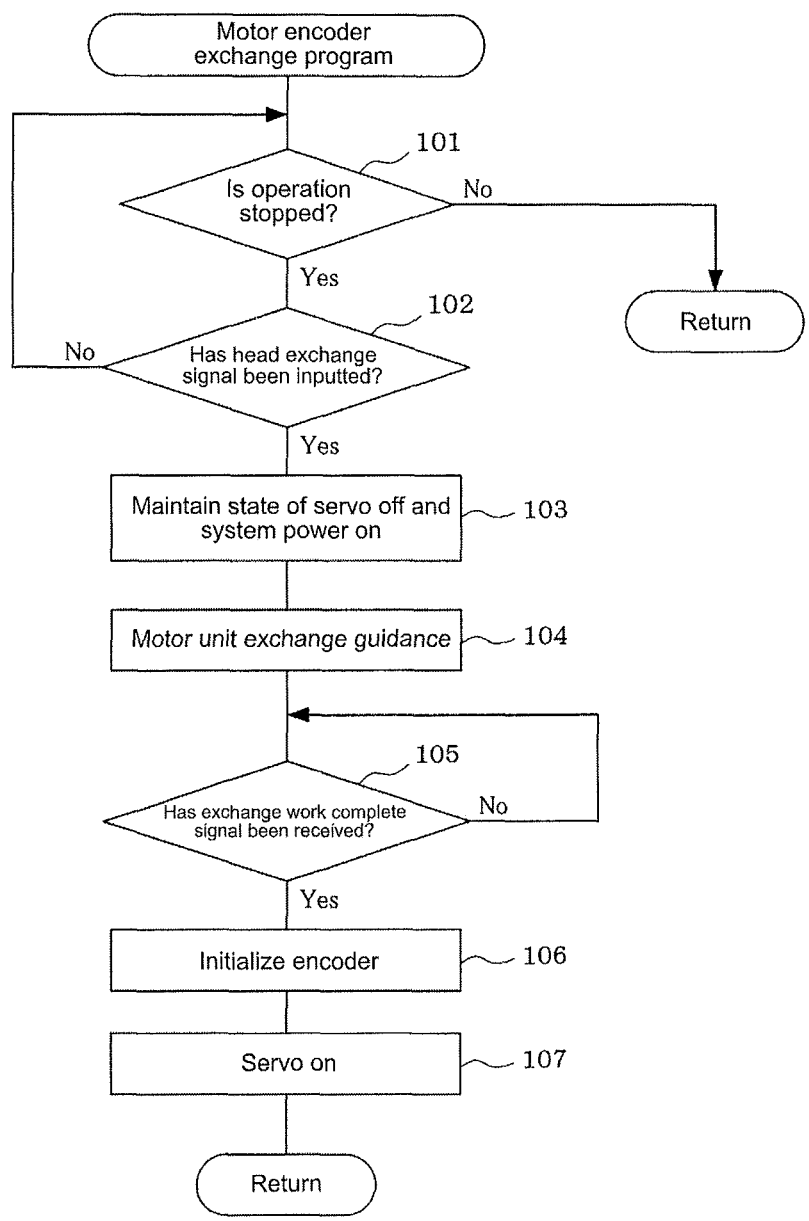
FIG. 2 is a flowchart showing the flow of processing of a motor unit exchange program.

Control device 27 of component mounter 10, by performing the motor unit exchange program of FIG. 2 described below, switches servo amplifier 14 from a servo on state to a servo off state before exchange of motor unit 11, maintains servo amplifier 14 system power in an on state, initializes encoder 13 of motor unit 11 connected to servo amplifier 14 after the motor unit 11 has been exchanged, and returns the servo amplifier 14 to a servo on state. Here, a servo on state is a state in which feedback control is performed on servo motor 12 such that rotation is restricted, and a servo off state is a state in which feedback control is not performed on servo motor 12 such that free rotation is allowed.

In the present embodiment, input device 30 (for example, an input means such as a keyboard, mouse, or touch panel) is provided for an operator to input a motor unit exchange signal to control device 27 of component mounter 10 before exchanging motor unit 11, and control device 27 of component mounter 10 is notified that an operator is going to exchange motor unit 11 by the motor unit exchange signal being inputted. For example, when exchanging a mounting head, because three motor units 11 of the R axis, the Q axis, and the Z axis are exchanged together with the mounting head, a motor unit exchange signal for these three motor units 11 is inputted as a mounting head exchange signal to control device 27 of component mounter 10. Information such as an identification number specifying the motor unit 11 to be exchanged is included in the motor unit exchange signal. However, if the motor unit 11 to be exchanged is always the same (for example, in a case in which, of the multiple motor units 11 loaded on component mounter 10, only motor units 11 of the mounting head are to be exchanged) the motor unit 11 to be exchanged can be specified without adding information such as an identification number of the motor unit 11 to be exchanged to the motor unit exchange signal.

Processing of the motor unit exchange program of FIG. 2 performed by control device 27 of component mounter 10 is described below. The motor unit exchange program of FIG. 2 is performed at a specified interval while the power is turned on for control device 27 of component mounter 10. When the program is run, first, in step 101, it is determined whether operation of exchangeable motor unit 11 is stopped, and if operation is not stopped (the motor unit is in operation), the program ends without performing further processing. This prevents servo amplifier 14 from being switched in a servo off state during operation of motor unit 11 due to a mistake of an operator.

In the above step 101, if it is determined that operation of exchangeable motor unit 11 is stopped, processing proceeds to step 102, and it is determined whether an operator is trying to exchange motor unit 11 (in the present embodiment, a mounting head) based on whether a motor unit exchange signal has been inputted. As a result, if it is determined that a motor unit exchange signal has not been inputted, processing returns to step 101. By this, monitoring is performed as to whether a motor unit exchange signal has been inputted while operation of exchangeable motor unit 11 is stopped.

On the other hand, in the above step 102, if it is determined that a motor unit exchange signal has been inputted, it is determined that an operator is trying to exchange motor unit 11, processing proceeds to step 103, and servo amplifier 14 is switched from a servo on state to a servo off state, and servo amplifier 14 system power is maintained in an on state. By this, a state is achieved in which an operator can exchange the exchange target motor unit 11.

Next, continuing to step 104, an operator is guided to exchange the exchange target motor unit 11 by a display or sound. Then, in step 105, it is determined whether the operator has completed exchange work of motor unit 11 based on whether control device 27 received an exchange work complete signal inputted via input device 30 when the operator completed exchange work of motor unit 11, and if an exchange work complete signal has not yet been received, a standby state is maintained until the exchange work complete signal is received.

Then, when the exchange work complete signal is received, processing proceeds to step 106 in which encoder 13 of the exchanged motor unit 11 is initialized, and in step 107, servo amplifier 14 is returned to a servo on state, and the program ends. By this, the exchanged motor unit 11 can be returned to a state in which operation can be started.

According to an embodiment described above, when an operator inputs a motor unit exchange signal to control device 27 before exchanging motor unit 11, servo amplifier 14 is switched to a servo off state, and servo amplifier 14 system power is maintained in an off state, therefore, it is possible to exchange motor unit 11 while servo amplifier 14 system power is maintained in an on state. Also, after motor unit 11 has been exchanged, by initializing encoder 13 and returning servo amplifier 14 to a servo on state, servo motor 12 of the exchanged motor unit 11 is able to have feedback control performed based on detection information of encoder 13, and operation of the exchanged motor unit 11 can be started. In this case, because it is not necessary to cut the servo amplifier 14 system power when exchanging motor unit 11, it is not necessary to provide an electric circuit for cutting the servo amplifier 14 system power, thus reducing the quantity of components and simplifying the circuit configuration, reducing the time required to design the circuit configuration and lowering costs. Further, after exchanging motor unit 11, it is not necessary to turn the servo amplifier 14 system power back on and to restart the system, so motor unit 11 exchange work time is reduced by the amount of time required for restarting, thus improving the operating rate (productivity) of component mounter 10.

Also, in the present embodiment, because exchanging motor unit 11 is prohibited during operation of motor unit 11, it is possible to prevent servo amplifier 14 being switched to a servo off state due to a mistaken operation of an operator during operation of motor unit 11.

Note that, the present disclosure is not limited to the present embodiment, and it goes without saying that various embodiments with changes that do not extend beyond the scope of the disclosure are possible, such as that a portion of the functions performed by control device 27 of component mounter 10 may be configured from hardware of one or multiple ICs or the like.

REFERENCE SIGNS LIST

10: component mounter; 11: motor unit; 12: servo motor; 13: encoder; 14: servo amplifier; 21: system power source line; 22, 23: driving power source line; 24: encoder signal line; 25. 26: connector; 27: control device; 30: input device (input means)

The invention claimed is:

1. A component mounter drive system comprising:
a component mounter including a servo motor as a drive source for a drive target of the component mounter, an encoder for detecting rotation of the servo motor, a servo amplifier for performing feedback control of rotation of the servo motor based on detection information of the encoder, and a control device for entering a command value of the feedback control to the servo amplifier;
a motor unit including the servo motor and the encoder, the motor unit being exchangeably attached to a specified portion of the component mounter to which the servo amplifier is attached; and
an input means configured to allow an operator to input a motor unit exchange signal to the control device before exchanging the motor unit and a motor unit exchange complete signal after the exchanging of the motor, wherein
the control device, when the motor unit exchange signal is received from the input means, switches the servo amplifier to a servo off state where the feedback control is disabled and the motor unit freely rotates, maintains system power of the servo amplifier in an on state, initializes the encoder connected to the servo amplifier when the motor unit exchange complete signal is received from the input means after the motor unit has been exchanged, and then returns the servo amplifier to a servo on state where the feedback control is performed on the motor unit,
wherein the control device is configured to determine whether operation of the motor unit has stopped prior to exchanging and if the operation is not stopped prohibiting exchange of the motor unit during operation of the drive target.

2. The component mounter drive system according to claim 1, wherein
the control device is further provided with a means for prohibiting exchange of the motor unit during operation of the drive target.

3. The component mounter drive system according to claim 1, wherein
the motor unit is attached to a mounting head exchangeably attached to a head moving device.

4. The component mounter drive system according to claim 1, further comprising:
a system power line that supplies the system power to the servo amplifier; and
a driving power source line that supplies driving power to the servo amplifier for driving the motor unit.

* * * * *